United States Patent [19]

Chang et al.

[11] Patent Number: 4,516,145

[45] Date of Patent: May 7, 1985

[54] REDUCTION OF CONTACT RESISTANCE IN CMOS INTEGRATED CIRCUIT CHIPS AND THE PRODUCT THEREOF

[75] Inventors: Jenq S. Chang; Tung S. Chang, both of Santa Clara County, Calif.

[73] Assignee: Storage Technology Partners, Louisville, Colo.

[21] Appl. No.: 528,336

[22] Filed: Aug. 31, 1983

[51] Int. Cl.³ .......................................... H01L 21/324
[52] U.S. Cl. ......................................... 357/42; 29/590; 29/576 R; 148/1.5; 148/187; 148/191
[58] Field of Search ................... 148/187, 1.5; 357/42; 29/576 R

[56] References Cited

U.S. PATENT DOCUMENTS

| | | | |
|---|---|---|---|
| 3,475,234 | 10/1969 | Kerwin et al. | 148/187 |
| 3,615,873 | 10/1971 | Sluss, Jr. et al. | 148/1.5 |
| 4,116,719 | 9/1978 | Shimizu et al. | 148/191 X |
| 4,125,426 | 11/1978 | Inayoshi et al. | 156/656 |
| 4,297,149 | 10/1981 | Koons et al. | 148/1.5 |
| 4,348,802 | 9/1982 | Shirato | 29/571 |
| 4,420,503 | 12/1983 | Leung et al. | 427/85 |
| 4,459,159 | 7/1984 | O'Mara | 148/1.5 |
| 4,476,621 | 10/1984 | Bopp et al. | 148/187 X |

*Primary Examiner*—G. Ozaki
*Attorney, Agent, or Firm*—Bryant R. Gold

[57] ABSTRACT

A process for forming the openings (vias) in the glass layer of complementary metal oxide semiconductor (CMOS) integrated circuit chips is presented. The pattern of openings is applied to the glass layer using conventional resist/mask techniques. A plasma is used to remove the glass, and the silicon dioxide layer, if there is one, to expose a portion of the N+ and P+ circuit elements. Decreased conductivity of the crystalline lattice structure of the N+ material, caused by exposure to the plasma, appears as an added resistor between the N+ material and the metallization layer. The added resistance is reduced to acceptable levels before the metallization layer is applied by placing the chip in an inert gas atmosphere at an appropriate elevated temperature for an appropriate time.

7 Claims, 5 Drawing Figures

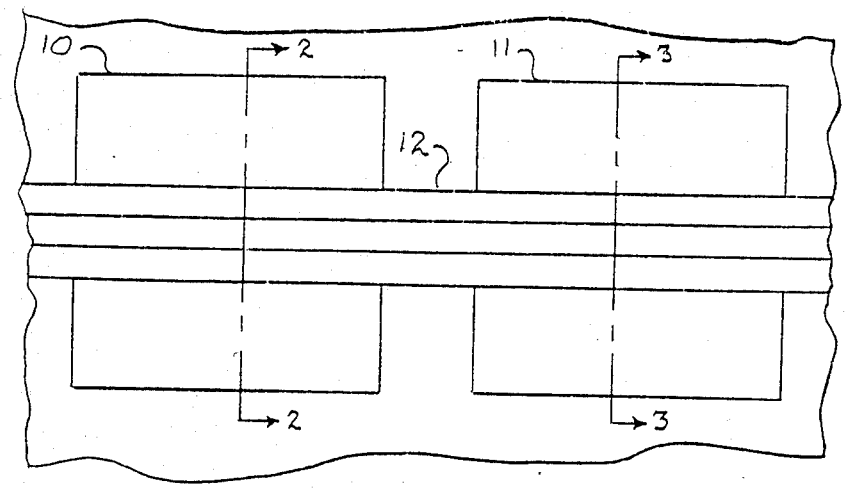
FIG. 1
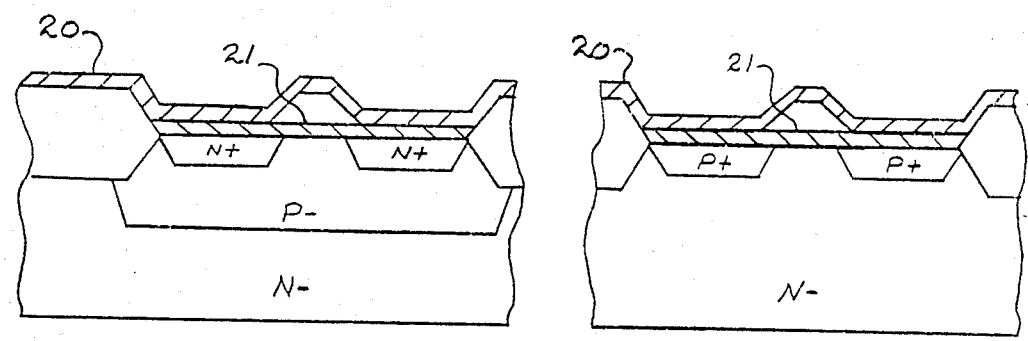
FIG. 2
FIG. 3
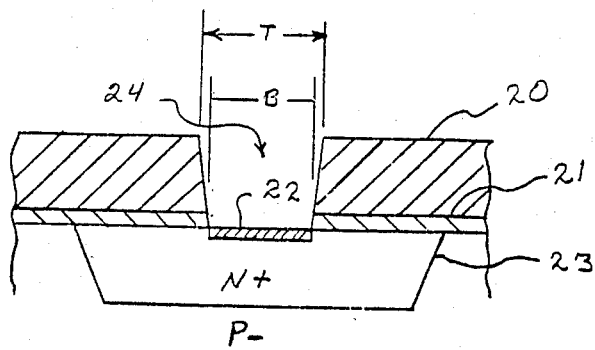
FIG. 4

REDUCTION OF CONTACT RESISTANCE IN CMOS INTEGRATED CIRCUIT CHIPS AND THE PRODUCT THEREOF

BACKGROUND OF THE INVENTION

This invention relates to the fabrication of complementary metal oxide semiconductor (CMOS) integrated circuits. More particularly, this invention relates to the fabrication of CMOS integrated circuits (IC's) having a reduced contact resistance when such IC's are fabricated using a plasma to etch vias (openings) in the glass insulating layers thereof.

When an integrated circuit chip is fabricated, it is one of many chips, arranged in an orderly array on a wafer of semiconductor material. When all of the circuit components, i.e., transistors, resistors, etc., have been formed on the wafer, it is coated with a thin layer of glass. Openings, called "vias," are then etched in the glass layer at selected points to expose elements of selected circuit components.

The circuit components are then interconnected to form circuits which perform the desired functions. The interconnections are made by depositing metal traces, in the desired pattern, between the vias. As the metal traces are being deposited on the glass layer, metal is also being deposited on the sides and bottom of the vias, forming an electrical connection between elements of circuit components. During this deposition process, the layer of glass acts as an insulation between the metal traces and the wafer. In many cases, more than one layer of metal traces is required to form all the interconnections necessary. In such cases, a layer of glass is formed over the previous layer of metal traces, vias are etched down to the wafer, and the next layer of metal traces is deposited. The details of the process of fabricating integrated circuits are, for purposes of this application, well understood in the art. Accordingly, other than for the process of etching vias, which is the subject of the present invention, no further explanation will be given herein.

In the prior art, before the integrated circuit technology advanced to what is now called very large scale integration (VLSI), a wet chemical, e.g., hydrofluoric (HF) acid was used to etch vias through the insulating glass layer(s). This process has an inherent disadvantage in that as the HF etches down into the glass, it also etches away the sides of the via. Thus, in forming an opening of a given size at the bottom of the glass (at the surface of the wafer), a much larger opening must be made at the top surface of the glass. A "wet-etched" via typically has, therefore, a "V" cross-sectional shape associated therewith.

As integrated circuit density increased to VLSI, the dimensions of the circuits, vias etc., decreased to the point where a wet chemical process could not be used for etching vias because the larger opening at the top of the via interfered with the area to be used for wiring traces or with other vias. Therefore, wet etching of vias was a major impediment to the development of VLSI integrated circuits and much time and effort was spent to find a process that produced vias with nearly vertical sides.

The solution found and presently used in the art to produce vias with nearly vertical sides is to use a plasma for etching the vias. In this process, the wafer is placed in an atmosphere of the appropriate gasses. The gasses are heated and excited by a radio frequently (RF) field to form a plasma. The plasma etches the via by both chemically reacting with the glass and by ion bombardment. Because of the RF field, the direction of etch is nearly straight down through the glass, and a via is formed whose top and bottom openings are very nearly the same size.

In CMOS technology, the etching process exposes both N+ elements of N channel transistors and P+ elements of P channel transistors. (The "+" and "−" signs refer to the relative doping of a given semiconductor material, and the "P" and "N" refer to the polarity of this doping.) Disadvantageously, plasma etching damages the surface of the N+ elements. The damage is primarily a disruption of the crystal lattice structure of the N+ material, and is believed to be caused by the plasma reacting more with the dopant used to form the N+ material in the silicon rather than reacting with the silicon itself. If not corrected, this reaction or damage adds resistance in the circuit formed by the subsequent wiring steps, which added resistance (commonly referred to as "contact resistance") disadvantageously slows down the performance of the circuit. Both rise and fall times as well as circuit delays are affected by the additional resistance. Since it is desirable to have integrated circuits perform their respective functions as fast as possible, the presence of this resistance is a process problem that must be corrected.

An obvious solution to this problem of added resistance would be to subject the wafer to a diffusion step that diffuses the dopant material back into the N+ region, thereby reducing the resistance. However, in CMOS, both N+ and P+ elements are simultaneously exposed, and the diffusion process would contaminate the P+ region unless preventative steps are taken. Thus, in order to correct the problem of added resistance, additional process steps of masking the vias over the P+ region, diffusing dopant into the N+ region, and removing the masking material would have to be followed. Not only do these additional process steps represent added expense and time, there is a good possibility that some of the masking material would remain in the vias over the P+ material, causing faulty electrical connections.

Another, more common solution known in the art to the problem of the added contact resistance is to follow a process that prevents it from occurring. This is done by using the plasma etch to form part of the via, but stopping the process before the plasma etches all the way through to the glass layer. The wafer is then subjected to an HF etch to complete the via. This solution, however, as explained below, is not suitable for use with CMOS technology.

In CMOS technology, a thin layer of silicon dioxide is formed over the N+ and P+ elements to act as an insulator for the gate before the glass layer is added. The HF must also etch through the silicon dioxide layer in order to expose the N+ and P+ elements. Unfortunately, the HF etches the glass approximately ten times faster than it etches the silicon dioxide. Thus, as the HF completes the process of opening the via, through the silicon dioxide, it is also etching into the sides of the via, undesirably widening the via as described above.

Hence, while the combined process of using plasma and HF etching results in a via smaller than those obtained by HF etching alone, the vias are nonetheless larger than if only plasma etching were used. Thus, by using a process that avoids forming the undesirable contact resistance, the density of the circuits that can be formed is restricted, since the top openings of the vias are wider than the bottom openings.

From the above discussion it is evident that there is a need in the art of CMOS technology for a process that allows the advantage of plasma etching of vias without having to introduce a multiplicity of additional process steps. The present invention is directed to that need.

SUMMARY OF THE INVENTION

A primary object of the present invention is to provide a process wherein only plasma etching is used to form nearly vertical vias in the glass and silicon dixoide layers of CMOS integrated circuit chips.

A further object of the invention is to provide such a process that effectively removes the resistance formed on the N+ elements as a result of the plasma etching.

The above and other objects of the invention are realized by a process wherein plasma alone is used to etch through the glass and the silicon dioxide layer between the glass and the N+ and P+ elements. The resistance formed on the surface of the N+ layer by the disruption of the crystal lattice due to the presence of the plasma is then removed by an annealing step. The annealing step comprises placing the wafer in an inert atmosphere at an appropriate high temperature for an appropriate length of time. The high temperature imparts sufficient thermal energy to the crystal lattice to allow doping material migrations to occur within the N+ material that correct most of the disruptions, and hence reduce the contact resistance of the N+ material, caused by exposure to the plasma. Advantageously, the temperature is not high enough to cause any meaningful diffusion of the N+ dopants used to form the semiconductor material away from the desired N+ regions. Further, there is no noticeable effect on the electrical properties of the circuits of the chip.

BRIEF DESCRIPTION OF THE DRAWINGS

The above and other objects, advantages, and features of the present invention will become more apparent from the following more particular description thereof presented in conjunction with the following drawings, wherein:

FIG. 1 is a top view of a portion of a typical CMOS chip, showing a complementary pair of transistors;

FIG. 2 is a cross-sectional view of a N-channel transistor, taken along the line 2—2 of FIG. 2;

FIG. 3 is a cross-sectional view of a P-channel transistor, taken along the line 3—3 of FIG. 3;

FIG. 4 is a cross-sectional view of a via through the glass layer and silicon dioxide layer, showing where additional resistance is formed by plasma etching.

DESCRIPTION OF THE PREFERRED EMBODIMENT

Figure 5:
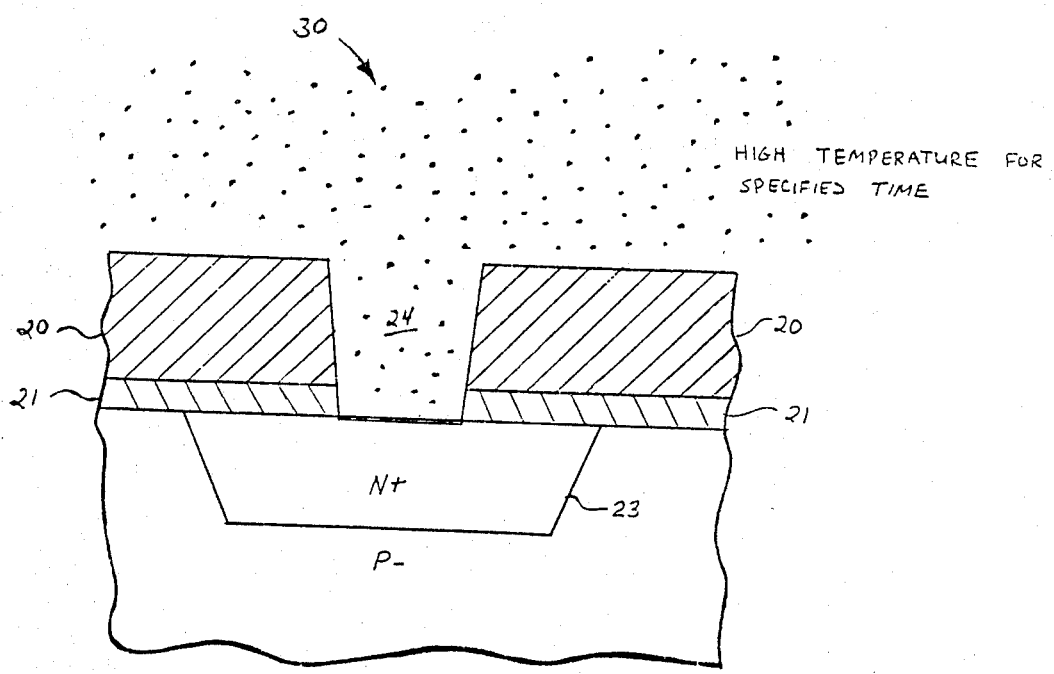
FIG. 5 is likewise a cross-sectional view as in FIG. 4, but depicts how the resistance is reduced by the process of the present invention.

The following is a description of the best presently contemplated mode of carrying out the present invention. This description is given only to illustrate the general principles of the invention and is not to be taken in a limiting sense. To ascertain the true scope of the invention, reference should be made to the appended claims.

FIG. 1 is a top view of a typical CMOS chip showing two complementary transistors 10-11 which have been formed on the chip. The rectangle 10 represents the region wherein an N-channel transistor is formed. The two transistors form a complementary pair by virtue of the common gate 12.

FIG. 2 is a cross-sectional view of the N-channel transistor 10 taken along the section line 2—2 of FIG. 1, while FIG. 3 is a cross-sectional view of the P-channel transistor 11 taken along the section line 3—3 of FIG. 1. FIGS. 2 and 3, which are not drawn to any scale, show the various doped regions which make up the CMOS transistors, i.e., N+, P+, N— and P—. As explained previously, the precise process used to form the transistors is not important to the present invention. Any known process steps could be used. What is important, and what is included in FIGS. 2 and 3, is the presence of the glass layer 20 and a silicon dioxide layer 21. An opening (via) must be made at selective locations through the layers 20-21 in order to allow electrical connections to be made to the N+ and P+ regions.

FIG. 4 is a cross sectional view of a via 24, not drawn to any scale, that has been etched by a suitable plasma etching process so as to pass through the glass layer 20 and silicon dioxide layer 21 to expose a portion of the N+ material 23. The plasma equipment used for this process may be similar to the Model AMT-8110 plasma etching apparatus available from Applied Materials Corporation of Santa Clara, Calif. As shown in the figure, the top dimension T of the via 24 is only slightly larger than the bottom dimension B. This is the desirable characteristic of the plasma etching process.

However, the undesirable characteristic of the plasma etching process when used with CMOS circuitry is that a resistive region 22 is formed in the N+ material 23 by the plasm. That is, as the plasma etches through the silicon dioxide layer 21, it begins to react with the N+ material 23. The N+ material 23 had been previously formed by diffusing an impurity (dopant), e.g., phosphorus or arsenic, into the silicon of the wafer, as is well known and practiced in the art. This dopant diffuses into the crystal structure of the silicon to form the semiconductor material N+.

The plasma reacts with the dopant to a larger degree than it does with the silicon, resulting in a very thin layer (e.g., 20-50 Angstroms) 22 that is partially depleted of the dopant. The result is an electrically less active layer, i.e., a material or region having a higher electrical resistance, typically about 100 ohms, at the surface where it is desired to make electrical contact with the N+ region 23. The P+ region is not affected by the plasma. If the metal traces are added to interconnect the circuits without removing this resistance, the resulting circuits will operate slower than they would without the resistance. This added resistance is thus an undesirable characteristic of the plasma etching process for the making of vias.

According to the process of the present invention, after the conventional plasma etching process has formed the via and the resulting resistive region in the N+ material, the wafer is placed in an inert or relatively inert atmosphere 30, e.g., nitrogen, neon, helium, or argon, at a high temperature, of from 900-950 degrees centigrade, for a period of time, of between 20-30 minutes. This process is schematically depicted in FIG. 5. The inert gas does not react with any of the exposed N+ or P+ regions but the high temperature provides sufficient thermal energy to the phosphorus or arsenic atoms (the dopant atoms) of the N+ material to cause these atoms to migrate into the high resistance region 22, thereby decreasing the resistance thereof. Advantageously, this annealing or heating process reduces the resistance of the region 22 by as much as a factor of five, thereby putting it at a level where it does not significantly affect the operating speed of the circuits derived from the CMOS chips. The temperature used is selected to correct the resistance problem but is not high enough to cause significant carrier diffusion between the N+, P+, N− and P− regions, since any such additional diffusion could cause undesirable changes in the characteristics of the circuits.

In summary, the invention, with two process steps, produces vias whose dimensions are closely controlled, thereby allowing the implementation of VLSI CMOS technology to a much higher density than has heretofore been possible.

EXAMPLE NO. 1

During the processing of a VLSI CMOS integrated circuit chip, vias having an approximate diameter of 2 microns were selectively etched through the glass and silicon dioxide layers using a plasma etching process and apparatus in accordance with the guidelines provided with a Model AMT-8110 plasma etcher, procured from Applied Materials Corporation of Santa Clara, California. The contact resistance of the resulting resistive layer formed at the bottom of the vias at the surface of the N+ regions was found to be 100-200 ohms per contact. The chip was exposed to a nitrogen atmosphere at 700° C. for 20-30 minutes. After cooling, the via contact resistance was found to be 40-100 ohms per contact.

EXAMPLE NO. 2

The same plasma etching process was used as described in EXAMPLE NO. 1 to selectively place 2 micron diameter vias through the glass and silicon dioxide layers of a VLSI CMOS integrated circuit chip. The chip was exposed to a nitrogen atmosphere at approximately 900° C. for 20-30 minutes. After cooling, the via contact resistance was found to be less than 40 ohms per contact.

What is claimed is:

1. A method for reducing the contact resistance of the surface area of an N+ region of a CMOS integrated circuit (IC) chip, which N+ region is accessed by plasma etching a via through an electrical insulating layer or layers that are deposited over said N+ region during the manufacturing process of said CMOS chip, said method comprising the steps of:
    (a) placing said IC in a relatively inert atmosphere;
    (b) elevating the temperature of said inert atmosphere to a temperature range of 900°-950° C., for a specified period of time; and
    (c) removing said IC from said heated atmosphere and allowing the IC to cool.

2. The method of claim 1 wherein said relatively inert atmosphere comprises an atmosphere of ntirogen.

3. The method of claim 2 wherein the specified period of time of step (b) comprises 20-30 minutes.

4. A CMOS integrated circuit (IC) chip having a plurality of vias through which conductive material is placed in order to selectively make electrical contact with desired doped regions formed within said chip, each of said electrical contacts having an electrical resistance of less than 40 ohms per contact, said CMOS IC being manufactured by a process that includes the steps of:
    (a) plasma etching said vias through an electrical insulating layer that is deposited over the doped region to which electrical contact is to be made; and
    (b) after plasma etching the vias, but before placing the conductive material in said vias, exposing the IC to a relatively inert atmosphere at a temperature of 900°-950° C. for a specified period of time.

5. The CMOS IC of claim 4 wherein the desired doped regions of which electrical contact is made through said vias comprise N+ regions.

6. The CMOS IC of claim 4 wherein the IC is exposed to the heated inert atmosphere for 20-30 minutes.

7. The CMOS IC of claim 6 wherein the inert atmosphere consists essentially of nitrogen.

* * * * *